United States Patent
Harada

[19]

[11] Patent Number: 5,818,103

[45] Date of Patent: Oct. 6, 1998

[54] SEMICONDUCTOR DEVICE MOUNTED ON A GROOVED HEAD FRAME

[75] Inventor: Takeshi Harada, Tokyo, Japan

[73] Assignee: NEC Corporation, Tokyo, Japan

[21] Appl. No.: 828,336

[22] Filed: Mar. 28, 1997

[51] Int. Cl.$^6$ .................................................. H01L 23/495
[52] U.S. Cl. ........................ 257/676; 257/667; 257/669; 257/674
[58] Field of Search .................... 257/669, 674, 257/666, 667, 676

[56] References Cited

U.S. PATENT DOCUMENTS

| | | | |
|---|---|---|---|
| 4,797,786 | 1/1989 | Manabe | 257/669 |
| 4,910,577 | 3/1990 | Sonoda et al. | 257/669 |
| 4,918,511 | 4/1990 | Brown | 257/669 |
| 4,942,452 | 7/1990 | Kitano et al. | 257/669 |
| 4,952,999 | 8/1990 | Robinson et al. | 257/669 |
| 5,150,193 | 9/1992 | Yasuhara et al. | 257/669 |
| 5,661,338 | 8/1997 | Yoo et al. | 257/674 |

FOREIGN PATENT DOCUMENTS

| | | | |
|---|---|---|---|
| 293970 | 12/1988 | European Pat. Off. | 257/669 |
| 5-55430 | 3/1993 | Japan | 257/669 |

*Primary Examiner*—David Ostrowski
*Attorney, Agent, or Firm*—Foley & Lardner

[57] ABSTRACT

A semiconductor device has a semiconductor chip mounted on the mounting portion of a lead frame and sealed with resin. The chip is affixed to the lead frame by melting. A groove is formed in the lead frame in a cruciform, radial, lattice or similar pattern capable of reducing thermal stress during intermittent performance test and cycling test while insuring heat radiation.

4 Claims, 4 Drawing Sheets

SEMICONDUCTOR DEVICE MOUNTED ON A GROOVED HEAD FRAME

BACKGROUND OF THE INVENTION

The present invention relates to a semiconductor device and, more particularly, to a semiconductor device capable of enhancing durability against intermittent performance test and cycling test while insuring heat radiation.

In parallel with the miniaturization of a semiconductor device, a semiconductor chip is increasing in size relative to a mounting material. As a result, stresses to act on the semiconductor device during the evaluation and test are increasing. One of conventional semiconductor devices includes a mounting material provided on a lead frame and having a high temperature conduction plate embedded therein. In this configuration, a semiconductor chip is mounted on the lead frame via the mounting material. Such a configuration, however, needs a step of embedding the conduction plate in the mounting material. This, coupled with the conduction plate itself, increases the cost of the semiconductor device. Therefore, a method eliminating the need for the conduction plate is desired.

To increase the durability of the semiconductor device against intermittent performance test and cycling test, the thickness of the mounting material may be increased on the basis of simulation or experiments. However, increasing the thickness of the mount material beyond a certain limit would obstruct heat radiation and would thereby prevent a desired thermal resistance characteristic from being achieved.

SUMMARY OF THE INVENTION

It is therefore an object of the present invention to provide a semiconductor device having enhanced durability against intermittent performance test and cycling test while insuring expected heat conduction.

A semiconductor device of the present invention has a lead frame formed with a groove in a mounting portion thereof, a mounting material provided on the mounting portion, and a semiconductor chip mounted on the mounting material and sealed with resin. The groove is configured such that the semiconductor chip is bonded at a central portion and corner portions thereof.

BRIEF DESCRIPTION OF THE DRAWING

The above and other objects, features and advantages of the present invention will become apparent from the following detailed description taken with the accompanying drawings in which.

In the drawings, identical reference numerals denote identical structural elements.

DESCRIPTION OF THE PREFERRED EMBODIMENTS

Figure 1:
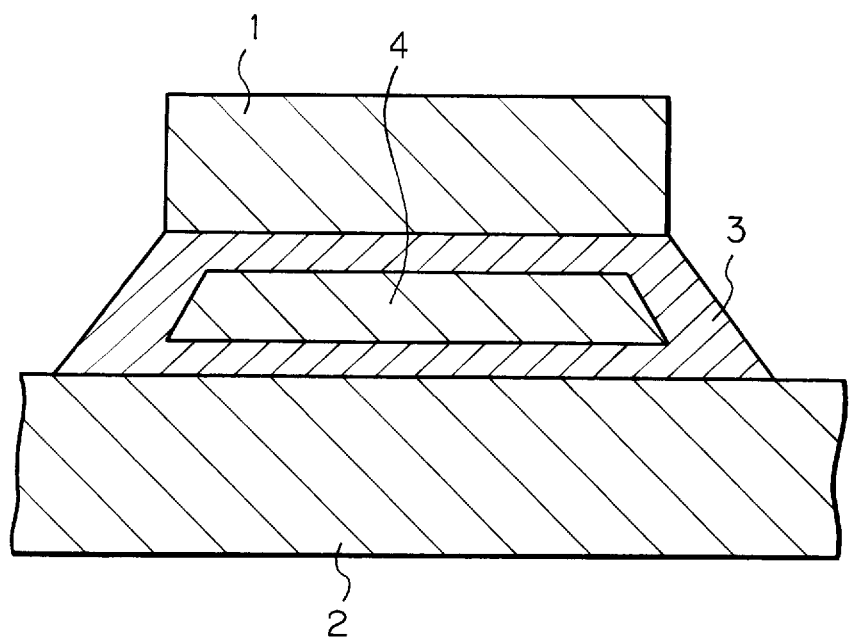
FIG. 1 is a fragmentary section showing a conventional semiconductor device.

To better understand the present invention, brief reference will be made to a conventional semiconductor device, shown in FIG. 1. As shown, the semiconductor device is made up of a lead frame 2, a mounting or bonding material 3, and a semiconductor chip 1 mounted on the lead frame 2 via the mount material 3. A high temperature conduction plate 4 is embedded in the mounting material 3. The conduction plate 4 may be formed with a groove. This semiconductor device has a problem in that a step of embedding the conduction plate 4 in the mounting material 3 is essential, and the plate 4 itself results in an extra cost, as discussed earlier. The thickness of the mount material 3 may be increased in order to enhance the durability of the device against an intermittent performance test and cycling test. However, should the thickness be increased beyond a certain limit, it would obstruct heat radiation and would thereby prevent a thermal resistance characteristic from being satisfied, as also discussed earlier.

Figure 2A:
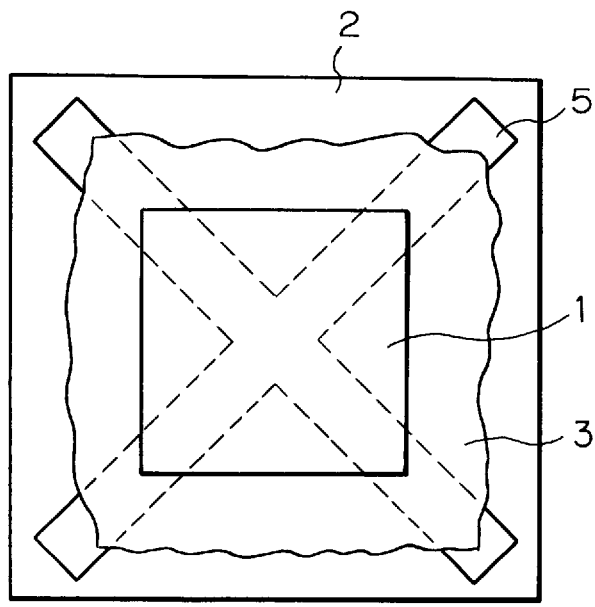
FIG. 2A is a plan view showing a semiconductor device embodying the present invention.
Figure 2B:
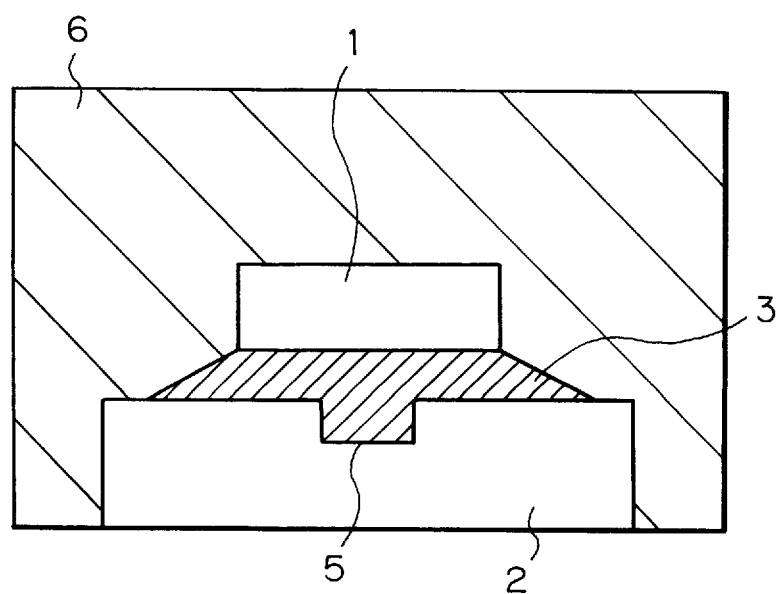
FIG. 2B is a section of the illustrated embodiment.

Referring to FIGS. 2A and 2B, a semiconductor device embodying the present invention will be described. As shown, the semiconductor device includes a lead frame 2 including a mounting portion formed with a groove 5. A semiconductor chip 1 is affixed to the mounting portion of the lead frame 2 via a mounting material 3 by melting. Resin 6 covers the side of the lead frame 2 where the chip 1 is mounted. The other side of the lead frame 2 is exposed to the outside, as illustrated. While the groove 5 generally has a rectangular cross-section, it should preferably have a semi-circular cross-section, considering the packing of the mounting material 3. The groove 5 should preferably have a width of 1 mm to 2 mm, a length greater than the length of the chip 1, and a depth of 10 $\mu$m to 80 $\mu$m, considering thermal stress and heat radiation.

Figure 3A:
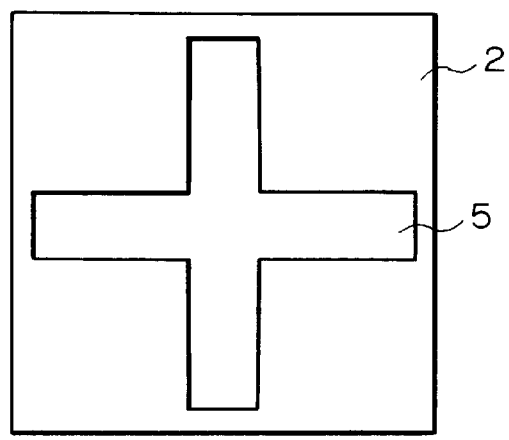
FIGS. 3A–3C are plan views each showing a particular configuration of a groove formed in a lead frame included in the embodiment.
Figure 3B:
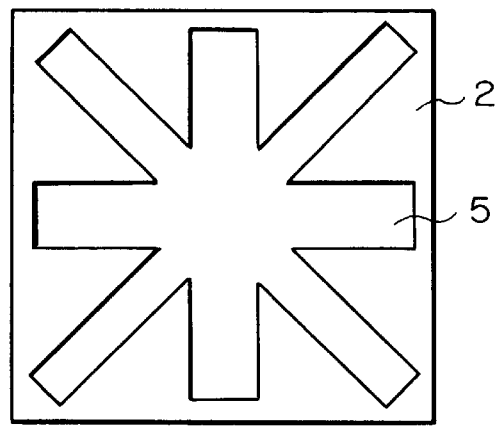
Figure 3C:
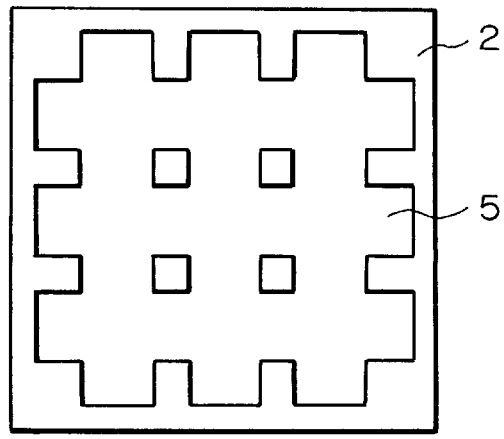

FIGS. 3A–3C show other specific configurations of the groove 5 formed in the lead frame 2. Any one of the configurations shown in FIGS. 3A–3C may be selected in conformity to the size of the semiconductor device. Specifically, the groove 5 of FIG. 3A is identical with the groove 5 of FIG. 2A except that it is rotated 45 degrees in order to enhance heat conduction. The grooves 5 shown in FIGS. 3B and 3C are respectively provided in a radial pattern and a lattice pattern, and each promotes the absorption of thermal stress during the evaluation and test of the semiconductor device.

Figure 4:
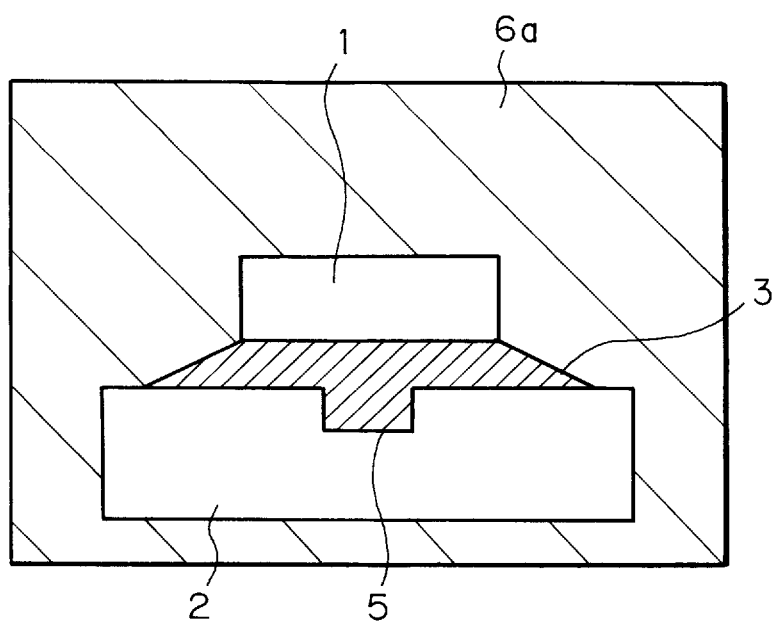
FIG. 4 is a fragmentary section showing an alternative embodiment of the present invention.

FIG. 4 shows an alternative embodiment of the present invention. As shown, the alternative embodiment is identical with the above embodiment except that resin 6a covers the entire surfaces of the lead frame 2.

In summary, in accordance with the present invention, a semiconductor device includes a lead frame formed with a groove in its mounting surface. The groove allows a mounting material to be thickened and thereby reduces thermal stress by 5% to 10% during the evaluation and test of the device. Further, because the groove is formed only partly in the lead frame, it enhances the reliability of the semiconductor device while insuring heat radiation. In addition, the partial groove allows the semiconductor device to be mounted thereon without regard to the size of the device, so that a single kind of lead frames suffice for semiconductor devices of various sizes. This successfully facilitates quantity production.

Various modifications will become possible for those skilled in the art after receiving the teachings of the present disclosure without departing from the scope thereof.

What is claimed is:

1. A semiconductor device comprising:
   a lead frame formed with a groove on one side thereof where a semiconductor chin is to be mounted, said groove having a width of 1 mm to 2 mm and a depth of 10 $\mu$m to 80 $\mu$m;
   a mounting material provided on said mounting portion; and
   said semiconductor chip mounted on said mounting material and sealed with resin;
   wherein said groove has a greater length than one side of said semiconductor chin and is configured such that said semiconductor chip is bonded at a central portion thereof.

2. A semiconductor device as claimed in claim 1, wherein said groove is formed in an X, cruciform, radial or lattice pattern.

3. A semiconductor device as claimed in claim 1, wherein said resin covers said semiconductor chip and said one side of said lead frame, including said groove, and wherein a side opposite said one side of said lead frame is exposed.

4. A semiconductor device as claimed in claim 1, wherein said resin covers said semiconductor chip and surrounds the entire lead frame.

* * * * *

UNITED STATES PATENT AND TRADEMARK OFFICE
CERTIFICATE OF CORRECTION

PATENT NO. : 5,818,103
DATED : October 6, 1998
INVENTOR(S) : Takeshi HARADA

It is certified that error appears in the above-identified patent and that said Letters Patent is hereby corrected as shown below:

On the title page, Item [54] and Column 1, lines 1-2

Title, contains a typographical error wherein "SEMICONDUCTOR DEVICE MOUNTED ON A GROOVED HEAD FRAME" should read -- SEMICONDUCTOR DEVICE MOUNTED ON A GROOVED LEAD FRAME--.

Signed and Sealed this

First Day of June, 1999

Attest:

Q. TODD DICKINSON

Attesting Officer

Acting Commissioner of Patents and Trademarks